United States Patent
Sprafke (10) Patent No.: US 7,795,573 B2
(45) Date of Patent: Sep. 14, 2010

(54) DETECTOR WITH MOUNTING HUB TO ISOLATE TEMPERATURE INDUCED STRAIN AND METHOD OF FABRICATING THE SAME

(75) Inventor: Thomas Sprafke, Malibu, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 0 days.

(21) Appl. No.: 12/272,450

(22) Filed: Nov. 17, 2008

(65) Prior Publication Data

US 2010/0123072 A1 May 20, 2010

(51) Int. Cl.
*G01T 1/24* (2006.01)
*H01L 27/00* (2006.01)
*H01L 31/00* (2006.01)

(52) U.S. Cl. ............... 250/208.1; 257/431; 257/731
(58) Field of Classification Search ............ 250/208.1, 250/239; 257/431, 731
See application file for complete search history.

(56) References Cited

U.S. PATENT DOCUMENTS

| | | | |
|---|---|---|---|
| 5,034,802 A * | 7/1991 | Liebes et al. ............... 257/672 |
| 5,074,036 A * | 12/1991 | Dunaway et al. ............... 29/834 |
| 5,274,224 A | 12/1993 | Poujois |
| 5,291,327 A | 3/1994 | McEwen |
| 5,298,733 A | 3/1994 | Ehmke |
| 5,337,217 A | 8/1994 | Tarn |
| 5,337,389 A | 8/1994 | Behrmann |
| 5,471,055 A | 11/1995 | Costanzo |
| 5,512,748 A | 4/1996 | Hanson |
| 5,554,847 A | 9/1996 | Salvio |
| 5,585,624 A | 12/1996 | Asatourian |
| 5,610,389 A | 3/1997 | Asatourian |
| 5,635,718 A * | 6/1997 | DePuydt et al. ........ 250/370.09 |
| 5,654,549 A | 8/1997 | Landecker |
| 5,670,009 A * | 9/1997 | Tarn et al. ................. 156/299 |
| 5,811,807 A | 9/1998 | Augeri |
| 5,955,733 A * | 9/1999 | Orava et al. ............ 250/370.08 |
| 6,163,028 A * | 12/2000 | Orava et al. ............ 250/370.08 |
| 6,184,529 B1 | 2/2001 | Contini |
| 7,154,156 B2 * | 12/2006 | Minamio et al. ............ 257/431 |
| 7,164,112 B2 * | 1/2007 | Takami et al. ............ 250/208.1 |
| 7,196,322 B1 | 3/2007 | Hsin |
| 7,221,441 B2 | 5/2007 | Douglas |
| 7,311,453 B2 * | 12/2007 | Li ............................ 396/529 |
| 7,338,009 B1 | 3/2008 | Bobinchak |

(Continued)

FOREIGN PATENT DOCUMENTS

WO   PCT/US00/40062   12/2000

*Primary Examiner*—John R Lee
(74) *Attorney, Agent, or Firm*—Koppel, Patrick, Heybl & Dawson (57) ABSTRACT

An imaging device and method of fabricating the same is disclosed. The imaging device may include an imaging sensor base, an image detector and a multilayer board. The imaging sensor base has a bonded hub having uniform flatness. The mounting hub sized to fit into a receptacle in the multilayer board. The image detector sized to match a size of the imaging sensor base and bonded to a top surface of the imaging sensor base. The imaging device may also include a readout integrated circuit (ROIC) sized to substantially match the size of the imaging sensor base and disposed on the image detector. A plurality of equi-spaced flexures and receptacles for receiving the plurality of flexures may also be used to maintain positional stability and minimize thermal strain.

17 Claims, 8 Drawing Sheets

U.S. PATENT DOCUMENTS

| | | | |
|---|---|---|---|
| 7,367,120 B2* | 5/2008 | Minamio et al. | 29/848 |
| 2004/0211986 A1* | 10/2004 | Minamio et al. | 257/222 |
| 2006/0016973 A1* | 1/2006 | Yang et al. | 250/239 |
| 2006/0028638 A1 | 2/2006 | Douglas | |
| 2007/0069319 A1* | 3/2007 | Minamio et al. | 257/433 |
| 2007/0164409 A1* | 7/2007 | Holland | 257/678 |
| 2008/0017941 A1 | 1/2008 | Yang | |
| 2008/0083980 A1 | 4/2008 | Yang | |
| 2008/0278617 A1* | 11/2008 | Tanida et al. | 348/340 |

* cited by examiner

DETECTOR WITH MOUNTING HUB TO ISOLATE TEMPERATURE INDUCED STRAIN AND METHOD OF FABRICATING THE SAME

This invention was made with Government support under FA8650-07-C-5414 awarded by the U.S. Air Force, Wright-Patterson Air Force Base (WPAFB), Air Force Research Lab (AFRL) to Teledyne Scientific & Imaging, LLC. The Government has certain rights in this invention.

BACKGROUND

This disclosure relates generally to imaging devices and more particularly to large scale detectors with mounting hubs to isolate temperature induced strain and methods of fabricating the same.

SUMMARY

An imaging device with a bonded hub having uniform flatness and a method of fabricating the same is disclosed. The imaging device includes an imaging sensor base and an image detector. The imaging sensor base has a mounting hub bonded on a bottom surface of the imaging sensor base. The mounting hub sized to fit into a receptacle. The image detector sized to match a size of the imaging sensor base and bonded to a top surface of the imaging sensor base. The imaging sensor base and the image detector composed of closely matched refractory materials. In one embodiment, the imaging device may also include a readout integrated circuit (ROIC) sized to substantially match the size of the imaging sensor base and disposed on the image detector. The imaging device may further include a multilayer board having the receptacle with which to fit the mounting hub of the imaging sensor base.

In one embodiment, the imaging device may also include a plurality of flexures and receptacles for receiving the plurality of flexures. The flexure receptacles engage with the flexures to increase the positional stability of and reduce the thermal load on a detector.

In one embodiment, a method of fabricating an imaging device is provided. The method includes bonding an image detector to a top surface of an imaging sensor base having a mounting hub on a bottom surface. The mounting hub sized to fit into a receptacle of a multilayer board. The imaging sensor base and the image detector composed of closely matched refractory materials. Next, the mounting hub may be coupled to the multilayer board by engaging the mounting hub through the receptacle and bonding the same. In another embodiment, the method includes coupling an image detector to a top surface of an imaging sensor base, engaging the plurality of equi-spaced flexures to the plurality of equi-spaced and opposite flexure receptacles of the mounting hub and the multilayer board, and coupling the mounting hub to the multilayer board.

BRIEF DESCRIPTION OF THE DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to an embodiment that provides an imaging device with an imaging sensor base having a mounting hub to isolate temperature induced strain on an image detector. The present invention, however, is not limited to any particular application nor is it limited by the examples described below. Various modifications to the disclosed embodiments will be apparent to those skilled in the art and the general principles defined herein may be applied to other embodiments and applications without departing from the spirit and scope of the invention. Therefore, the description of the embodiments that follow are for purposes of illustration and not limitation.

Detectors may be used in applications such as long range terrestrial surveillance, targeting, space missions, and ground-based as well as space-based astronomy. Detectors may include imaging sensors for infrared and visible imaging applications. Generally, imaging sensors used for visible imaging applications are conventional charge-coupled device (CCD) type imagers, monolithic complimentary metal-oxide-semiconductor (CMOS) type imagers, "substrate-removed" Mercury-Cadmium-Telluride (MCT), and the like.

As detectors become larger and larger in scale, a problem that frequently occurs is warping due to increased thermal stress and thermal strain from high operating temperatures. Thus, detector design is generally limited by the coefficient of thermal expansion (CTE) of the various materials used to mount the detector. Attempts to address this warping problem have generally focused on surface bonding techniques. However, these techniques fail to address the increased thermal stress and thermal strain on the detector.

A large number of detectors may be formed in a focal plane array (FPA) for a variety of government and commercial applications. Usually, detectors in a large FPA are formed in a 4096×4096 (detector$^2$) mosaic. However, as temperatures increase in large FPAs, the individual detectors may move around as a result of thermal expansion. Therefore, the detectors in large FPAs may lack positional stability and may be prone to damage because of the distributed thermal strain.

As can be appreciated by a person skilled in the art, the present disclosure is directed to an imaging device that avoids the problems caused by thermal strain, provides positional stability and/or protects detectors arranged in a large-scale FPA configuration.

Figure 1:
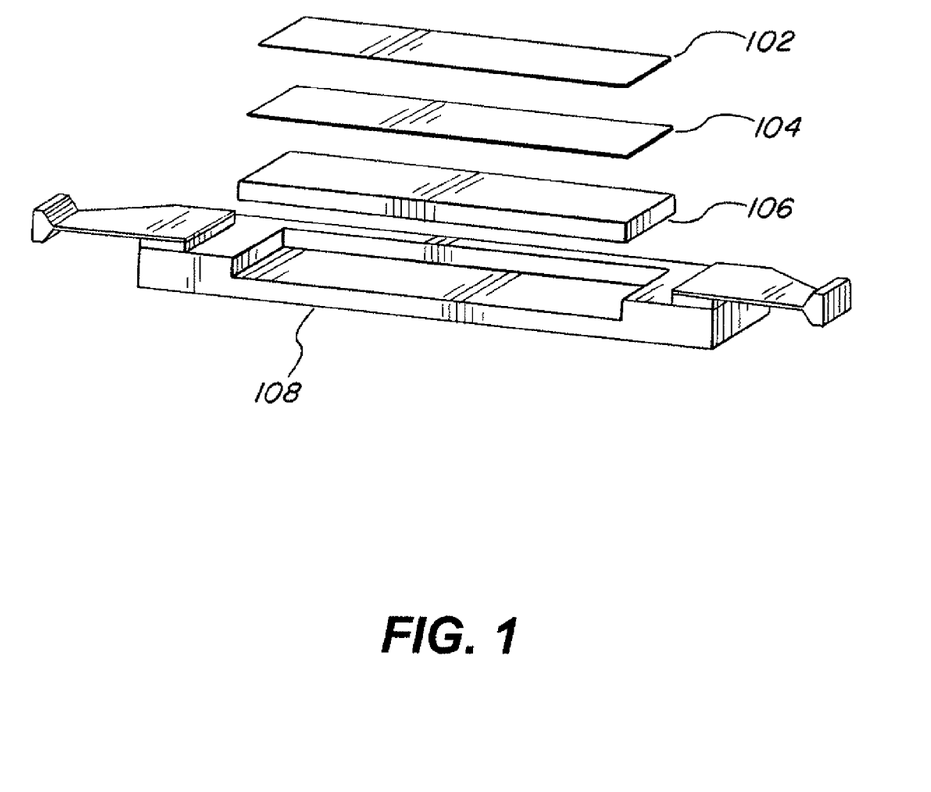
FIG. 1 is an exploded view of a large detector susceptible to high thermal strain.

FIG. 1 is an exploded view of a large detector susceptible to high thermal strain. Readout Integrated Circuit (ROIC) 102 is formed above image detector 104, which was formed or bonded to a top surface of imaging sensor base 106. Finally, multilayer board 108 may be bonded to a bottom surface of the imaging sensor base 106. ROIC 102 may be manufactured from CMOS fabrication techniques well known to persons skilled in the art. Image detector 104 is sensitive to, and may detect a broad spectrum of light ranging from below 0.3 micron ultra-violet (UV) to 18 micron long-wave infrared (LWIR). Imaging sensor base 106 may be manufactured from molybdenum, nickel steel alloy, nickel-cobalt ferrous alloy, beryllium, alumina, aluminum nitride, Invar or Kovar. Finally, multilayer board 108 may be manufactured from ceramic material or alumina.

As shown in FIG. 1, the multilayer board 108 is a full face mount with a large surface area subjected to high levels of thermal strain. As a result, the detector 104 may become damaged or warped due to thermal strain caused by large temperature swings. With many detectors 104 arranged in a large focal plane array (FPA), the detectors 104 could experience movement due to thermal expansion.

Figure 2:
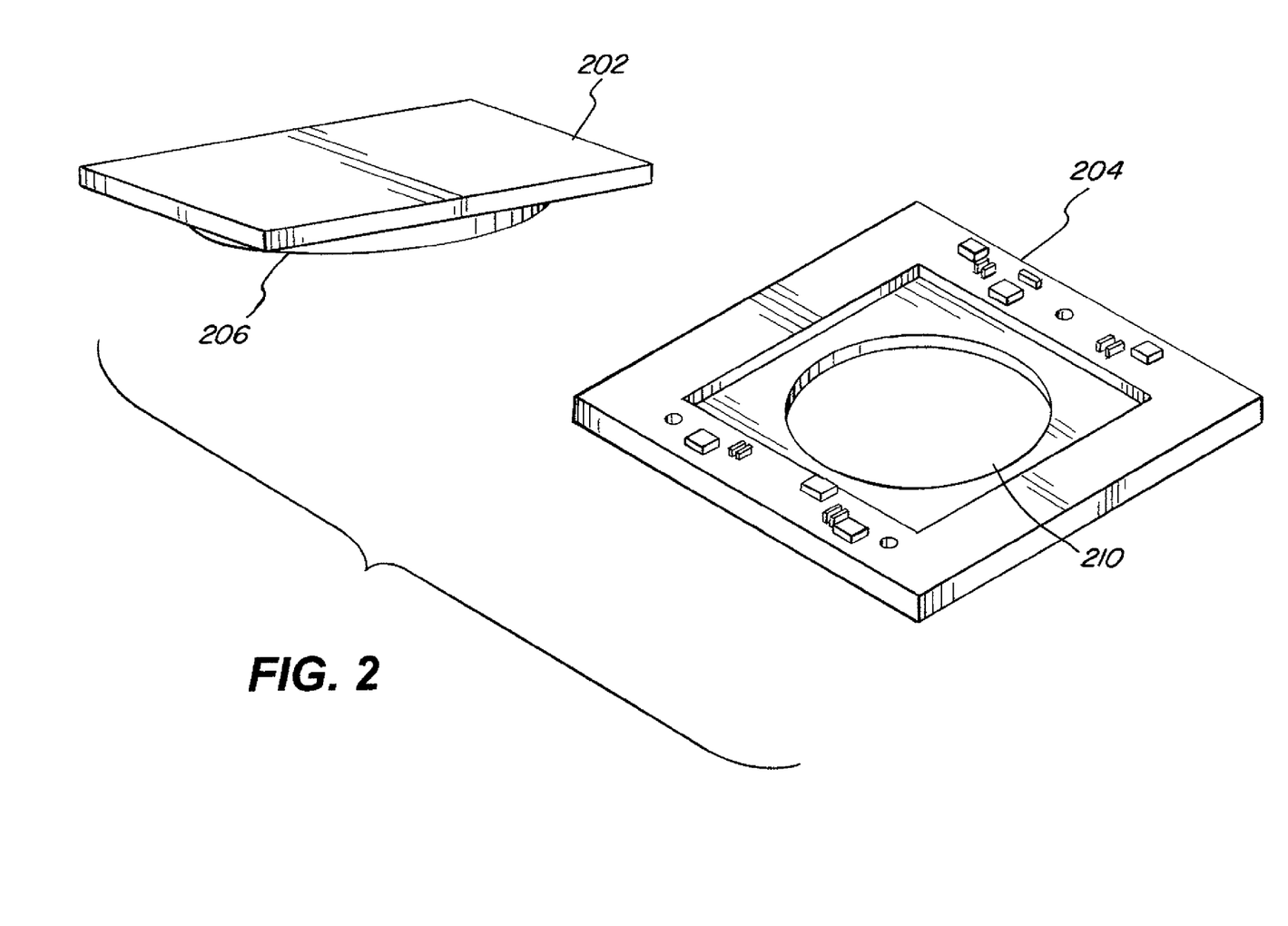
FIG. 2 illustrates an imaging sensor base and a multilayer board, according to an embodiment of the present disclosure.

FIG. 2 illustrates an imaging sensor base 202 and a multilayer board 204, according to an embodiment of the present disclosure. Imaging sensor base 202 is shown with a bottom surface having a mounting hub 206. As in FIG. 1, an image detector and ROIC (not shown), may be bonded to the top surface of the imaging sensor base 202 to form a detector unit. Multilayer board 204 may include a receptacle 210, shown in FIG. 2 as taking on a circular shape. However, the shape of receptacle 210 is not limited to a circular shape and may be, for instance, be rectangular, triangular, trapezoidal or any other shape as appropriate. In FIG. 2, mounting hub 206 is shown to be sized in a circular shape as well in order to fit into the receptacle 210 of the multilayer board 204. The multilayer board 204 may be made of ceramic material or alumina.

Figure 4A:
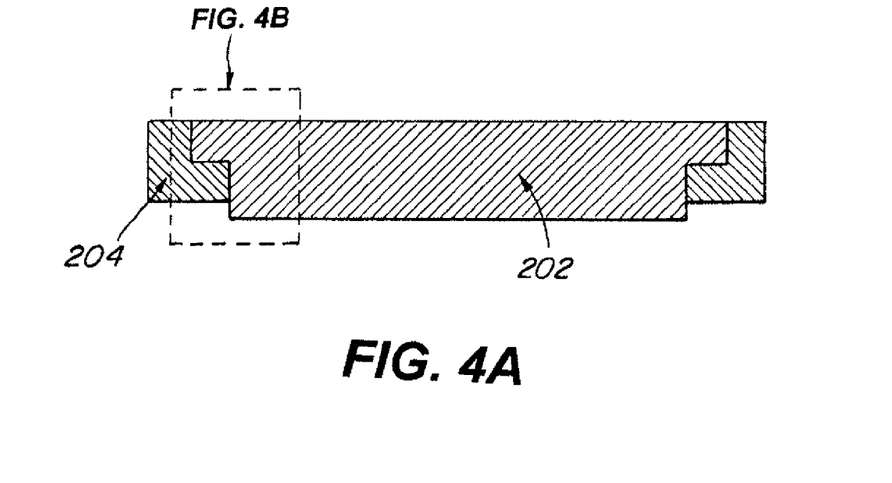
FIG. 4A is a side view illustrating the multilayer board receiving the detector unit of FIG. 3, according to an embodiment of the present disclosure.
Figure 4B:
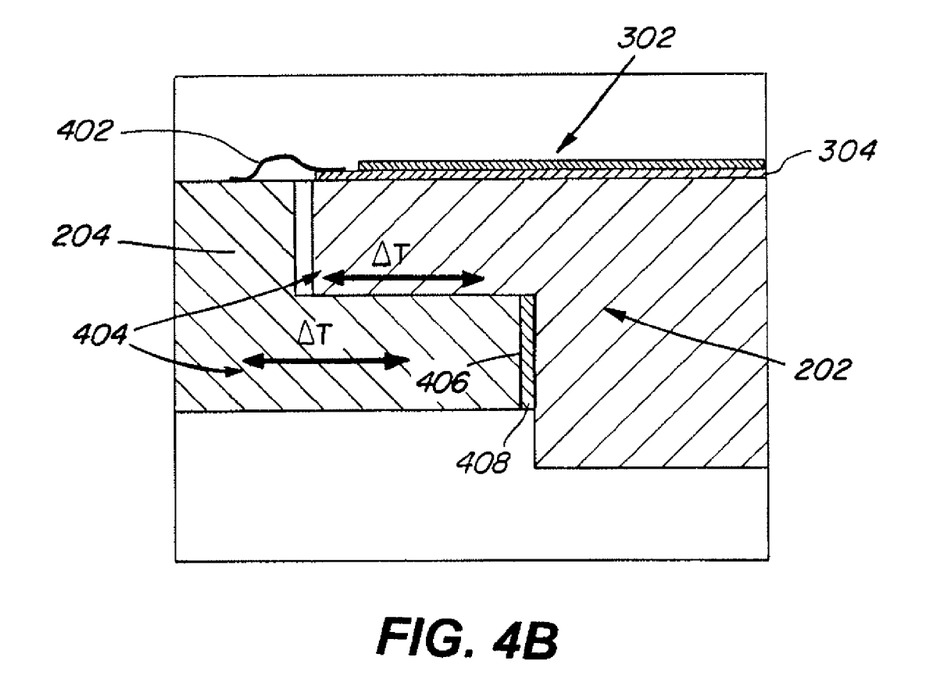
FIG. 4B is an expanded side view of the dashed line region shown in FIG. 4A, according to an embodiment of the present disclosure.

In order to bond the imaging sensor base 202 having the mounting hub 206 with the multilayer board 204, epoxy may be used. How the epoxy bonds using an epoxy bond line will be described in further detail with reference to FIG. 4. As an alternative to epoxy, alumina powder or silver may be used to bond the imaging sensor base 202 having the mounting hub 206 with the multilayer board 204. Any bonding around mounting hub 206 effectively de-couples the temperature induced thermal strain energy from the top surface of the imaging sensor base 202, where the detector is placed. Therefore, the thermal load is spread out over the entire surface of the detector unit, which prevents shifting or warping problems caused by excessive thermal strain.

Figure 3:
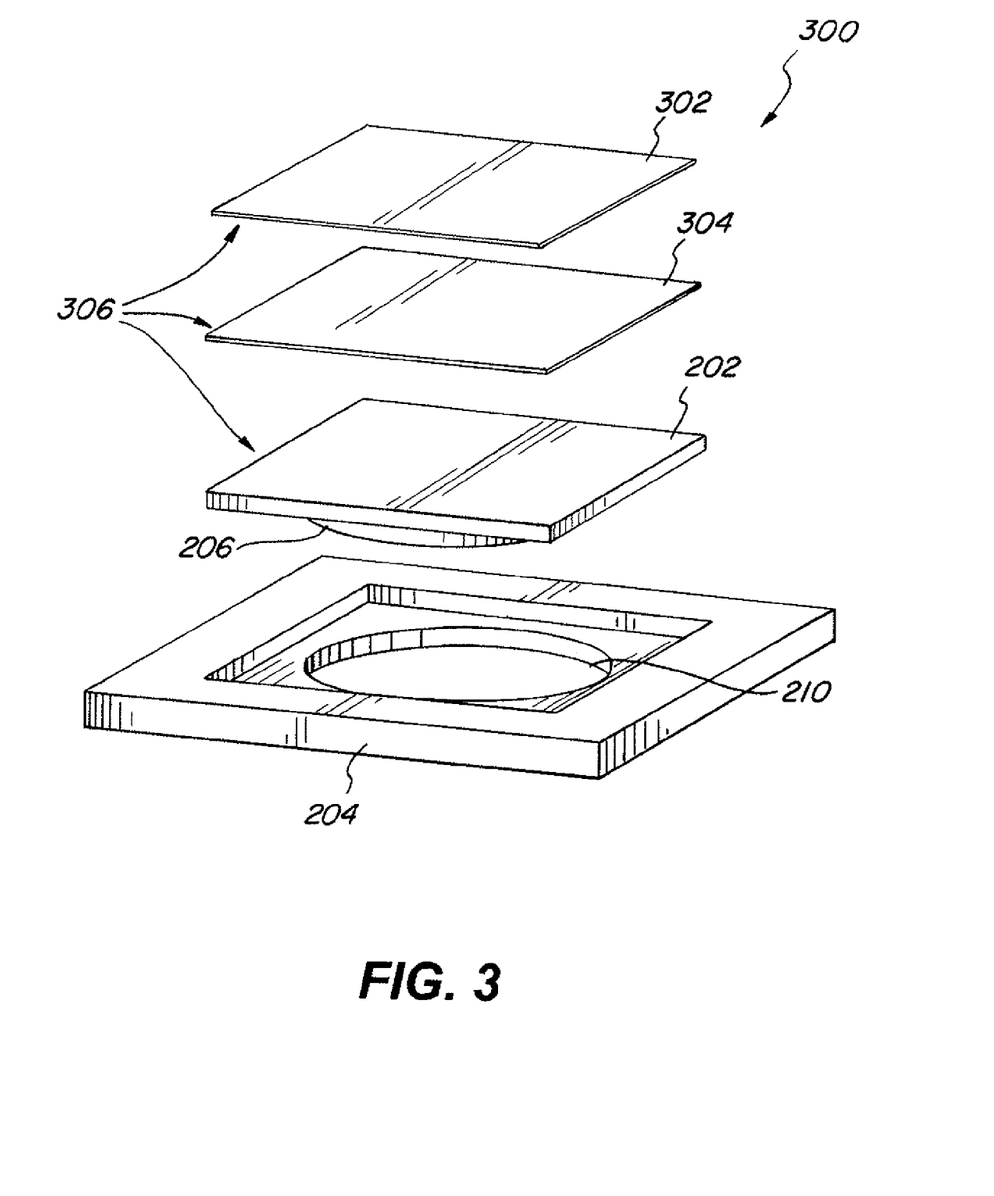
FIG. 3 is an exploded view of an imaging device having a detector unit and a multilayer board, according to an embodiment of the present disclosure.

FIG. 3 is an exploded view of an imaging device 300 having a detector unit 306 and a multilayer board 204, according to an embodiment of the present disclosure. The detector unit 306 may include a readout integrated circuit (ROIC) 302, an image detector 304 and the imaging sensor base 202. In one embodiment, the image detector 304 may be formed or bonded to the ROIC 302 on one side and formed or bonded to the imaging sensor base 202 on the other side. Imaging sensor base 202 has a bottom surface with mounting hub 206.

The multilayer board 204 may include a receptacle 210, shown in FIG. 2 and FIG. 3 as taking on a circular shape. Again, the shape of receptacle 210 is not limited to a circular shape and may be, for instance, be rectangular, triangular, trapezoidal or any other shape as appropriate. Epoxy may be used to bond the detector unit 306 to the multilayer board 204. Specifically, the epoxy may be used to bond the mounting hub 206 with the receptacle 210 of the multilayer board 204. As an alternative to epoxy, alumina powder or silver may be used to bond the imaging sensor base 202 with the multilayer board 204. Any bonding around mounting hub 206 effectively de-couples the temperature induced thermal strain energy from the top surface of the imaging sensor base 202, where image detector 304 and ROIC 302 are placed. Therefore, the thermal load is spread out over the entire surface of the detector unit 306, which prevents shifting or warping problems caused by excessive thermal strain. In order to further alleviate problems caused by thermal strain, the imaging sensor base 202 and the image detector 304 may be fabricated from closely matched refractory materials having substantially the same coefficients of thermal expansion (CTE).

ROIC 102 may be manufactured from CMOS fabrication techniques well known to persons skilled in the art. Image detector 304 is sensitive to, and may detect a broad spectrum of light ranging from below 0.3 micron ultra-violet (UV) to 18 micron long-wave infrared (LWIR). Imaging sensor base 202 may be manufactured from molybdenum, nickel steel alloy, nickel-cobalt ferrous alloy, beryllium, alumina, aluminum nitride, Invar or Kovar. Multilayer board 204 may be manufactured from ceramic material or alumina.

FIG. 4A is a side view illustrating the multilayer board 204 receiving the detector unit 306 of FIG. 3, according to an embodiment of the present disclosure. The mounting hub 206 of imaging sensor base 202 may fit into and engage with the receptacle 210 of multilayer board 204.

FIG. 4B is an expanded side view of the dashed line region shown in FIG. 4A illustrating the imaging sensor base 202 coupled to the multilayer board 204, according to an embodiment of the present disclosure. Wire bond 402 may be used to connect the ROIC 302 and image detector 304 to the multilayer board 204. Imaging sensor base 202 may be bonded to multilayer board 204 along an epoxy bond line 406. Thermal expansion lines 404 demonstrate the amount of thermal expansion the material of the multilayer board 204 and the material of the imaging sensor base 202 undergo due to an increase in temperature.

As can be appreciated by a person skilled in the art, any bonding material may be used to couple the imaging sensor base 202 to the multilayer board 204. For example, an epoxy 408, such as a Hysol® epoxy, available from any store that sells adhesives, coatings or castings, may be used. In one embodiment, the yield strength of a bonding material (i.e. epoxy) may be determined by the equation:

$$\sigma_{epoxy} = \frac{E_{epoxy}}{(1-v_{epoxy})}(\alpha_{ISB}-\alpha_{MB})\Delta T \frac{\text{radius}}{\text{gap}}$$

where, $\sigma_{epoxy}$ is the yield strength of the epoxy, $E_{epoxy}$ is the Elastic Modulus (E) of the epoxy, $v_{epoxy}$ is the Poisson's Ratio of the epoxy, $\alpha_{ISB}$ is the coefficient of Thermal Expansion of the imaging sensor base 202, αhd MB is the coefficient of Thermal Expansion of the multilayer board 204, ΔT is the change in temperature, radius is the radius of the receptacle 210, and gap is the spacing between the imaging sensor base 202 and the multilayer board 204 filled in with epoxy 408.

Figure 5:
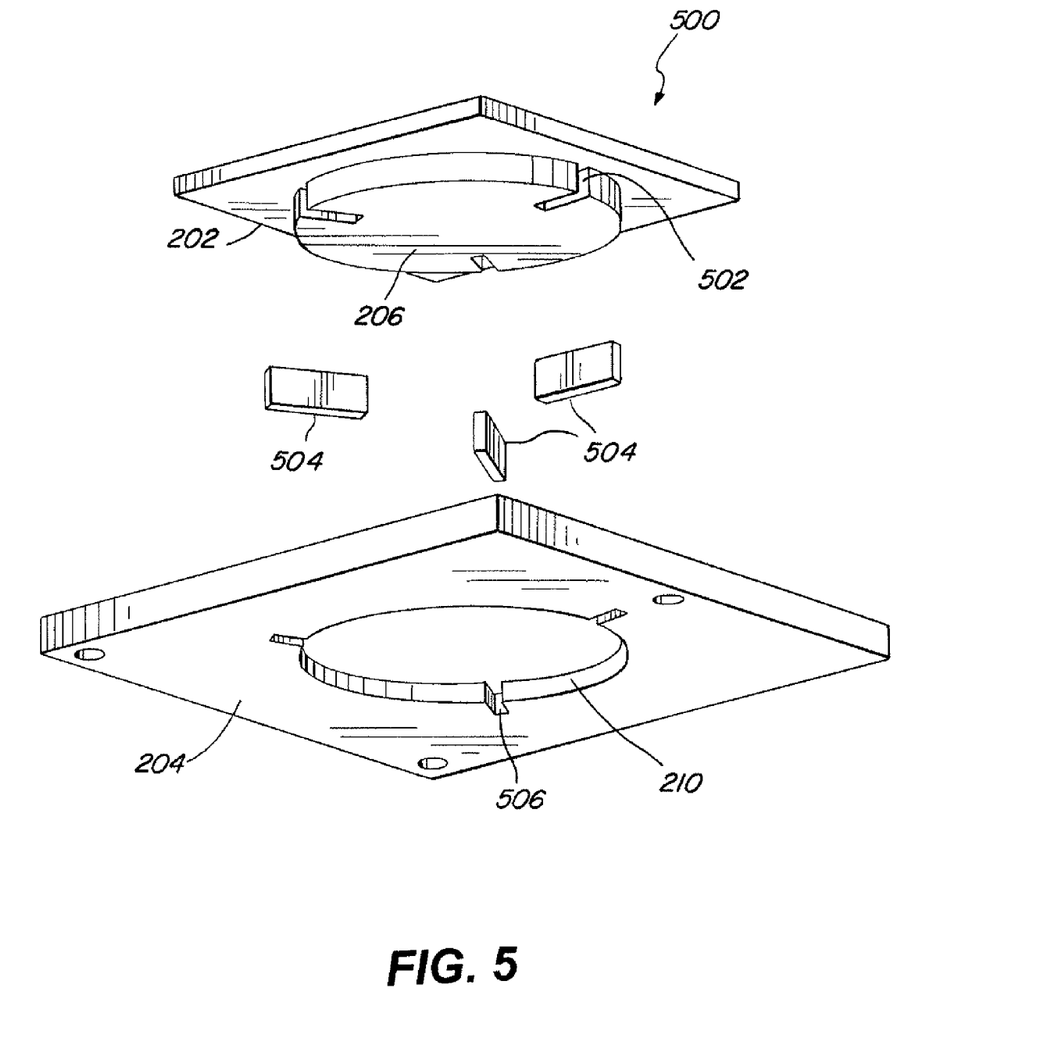
FIG. 5 is a first exploded view of an imaging device with a plurality of equi-spaced flexures, an imaging sensor base, and a multilayer board, according to an embodiment of the present disclosure.
Figure 6:
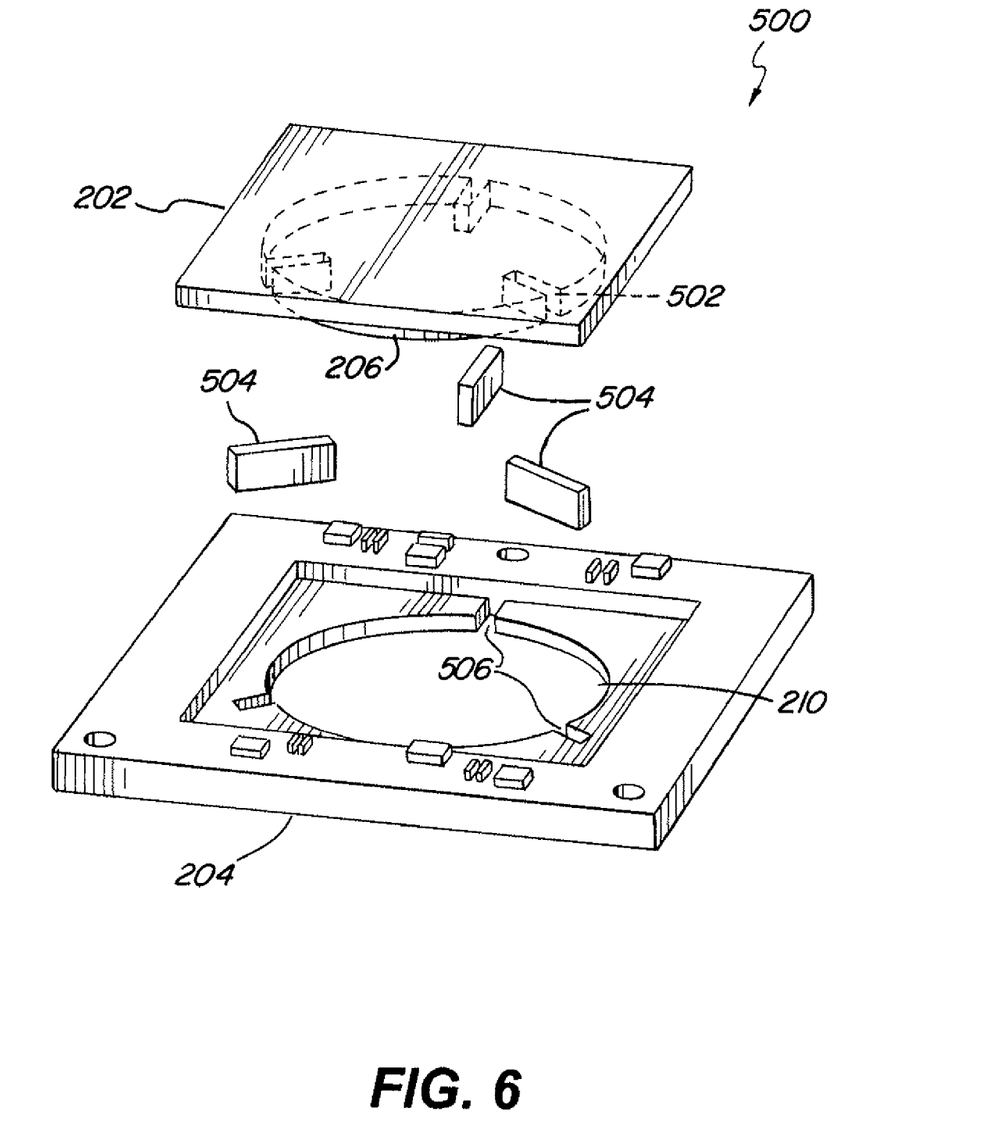
FIG. 6 is a second exploded view of the imaging device of FIG. 5, according to an embodiment of the present disclosure.

FIGS. 5 and 6 are exploded views of an imaging device 500 with a plurality of equi-spaced flexures 504, an imaging sensor base 202, and a multilayer board 204, according to an embodiment of the present disclosure. The imaging sensor base 206 may include a plurality of equi-spaced flexure receptacles 502. For example, the circumference of the mounting hub 206 may have one or more of the equi-spaced flexure receptacles 502. Similarly, the multilayer board 204 may include a receptacle 210 with a plurality of equi-spaced flexure receptacles 506 to fit the imaging sensor base 206 along with the plurality of equi-spaced flexures 504. The plurality of equi-spaced flexure receptacles 502, 506 may be used to engage with or receive the plurality of equi-spaced flexures 504. The equi-spaced flexures 504 may be fabricated from titanium, gamma alumina, or any material that exhibits low thermal conductivity in order to alleviate thermal strain.

By using equi-spaced flexures, the temperature-induced thermal strain energy may be de-coupled, distributed and spread out from the detector unit 306. As can be appreciated, this may reduce the thermal load, minimize power dissipation, provide heightened thermal isolation and prevent warping of and/or damage to the detector 304. FIG. 5 and FIG. 6 illustrate how the equi-spaced flexures 504 combined with a circular receptacle 210 and equi-spaced flexure receptacles 506 are able to radially relieve thermal strain, thereby limiting detector shift or movement over large temperature swings. As can be appreciated, this configuration achieves uniform flatness of detector 304, which further aids in the relief of temperature-induced thermal strain. Although a circular thermal strain relief system is described, the receptacle 210 in FIG. 5 and FIG. 6 is not limited to a circular shape. For instance, the receptacle 210 may be in any shape (e.g. triangular, trapezoidal), along with appropriate cut-outs 506 for receiving flexures 504.

Figure 7:
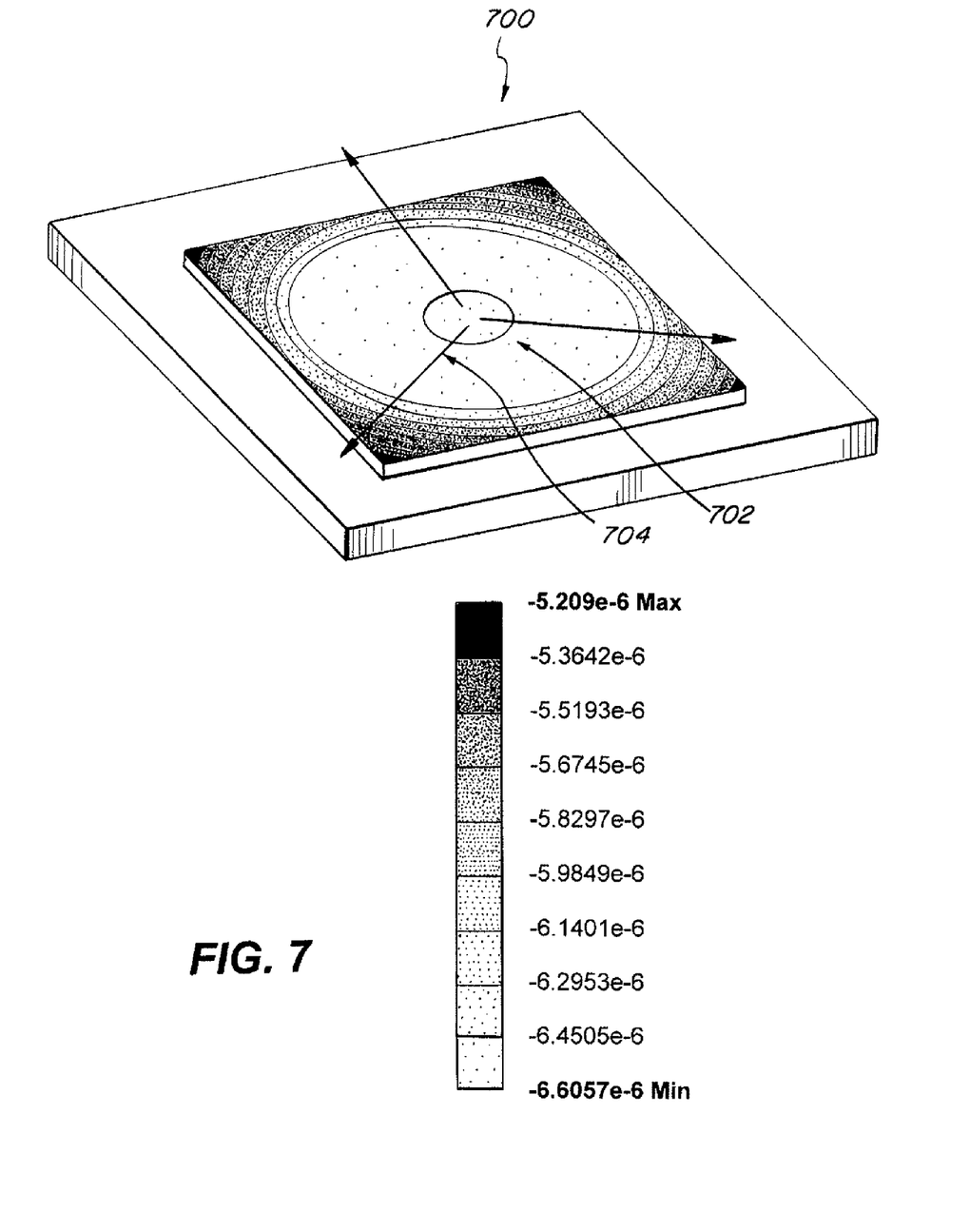
FIG. 7 illustrates a directional deformation diagram displaying the uniform flatness of the detector unit, according to an embodiment of the present disclosure.

FIG. 7 illustrates a directional deformation diagram 700 displaying the uniform flatness of the detector, according to an embodiment of the present disclosure. The diagram 700 shows that a substantial majority of the detector 304 is uniformly level with substantially the same elevation or flatness 702. Directional deformation gradient 704 illustrates that the uniform flatness extends out radially from the center. From the experimental results shown in FIG. 7, the detector 304 exhibits an exceptional detector flatness of about 1.4 μm over a 305° K temperature change. Additionally, using equi-spaced flexures 504, the diametric shift is minimized to about 10 μm, over the same 305° K temperature change.

Figure 8:
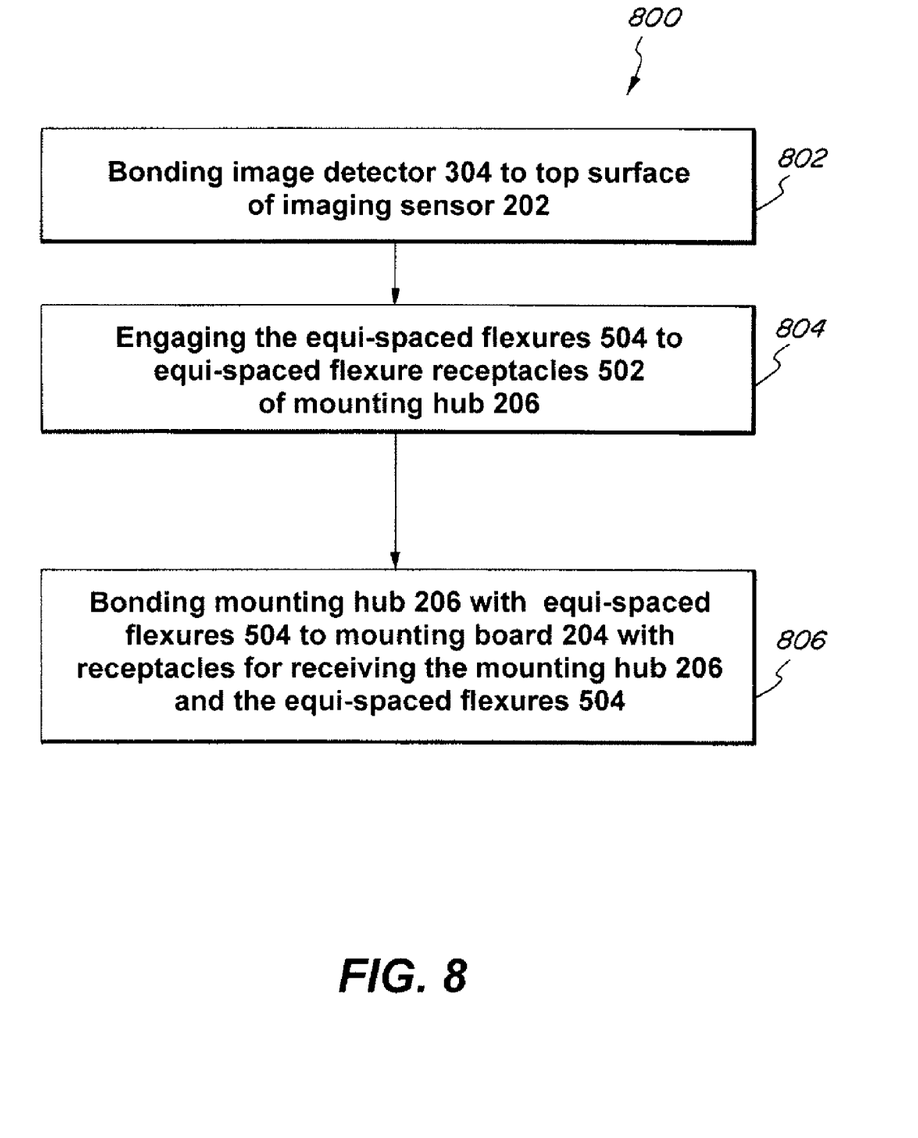
FIG. 8 is a flowchart illustrating a method for bonding an imaging sensor base with a multilayer board, according to an embodiment of the present disclosure.

FIG. 8 is a flowchart 800 illustrating a method for bonding an imaging sensor base 202 with a multilayer board 204, according to an embodiment of the present disclosure. The process for bonding the imaging sensor base 202 with the multilayer board 204 may begin by coupling (for example, bonding) the image detector 304 to the top surface of imaging sensor base 202 (802). On its bottom surface, the imaging sensor base 202 may include a mounting hub 206 substantially sized to fit into a receptacle. For embodiments with equi-spaced flexures 504, these flexures 504 may then be engaged with or received by the equi-spaced flexure receptacles 502 of the mounting hub 206 (804). Next, the imaging sensor base 202 may then be coupled to the multilayer board 204 by engaging the mounting hub 206 through the receptacle 210 and applying a bonding material therebetween. For embodiments with flexures 504, the mounting hub 206 along with inserted equi-spaced flexures 504, may be bonded to the receptacles 210 and 506 of multilayer board 204. As a result, a uniformly flat imaging device with a bonded hub is achieved that minimizes damage and positional shift caused by thermal strain.

As can be appreciated, the present invention provides a detector with a bonded hub having uniform flatness to decouple, distribute and spread out temperature-induced thermal strain. Equi-spaced flexures may be used to further decouple the thermal strain, reduce the thermal load, reduce power dissipation and prevent positional shift or movement of the detector caused by thermal expansion. As such, the detector design, illustrated in the embodiments of the present disclosure, may exhibit increased detector longevity, heightened performance, improved thermal efficiency and high positional stability for large focal plane arrays. Applications of the present invention may include use with large-scale detectors or large area chip sensors in a variety of indoor, outdoor, ground-based and space-based environments.

While imaging devices with a mounting hub and with or without flexures have been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. An imaging device comprising:
    an imaging sensor base having a mounting hub on a bottom surface, the mounting hub sized to fit into a receptacle; and
    an image detector sized to substantially match a size of the imaging sensor base and bonded to a top surface of the imaging sensor base, the imaging sensor base and the image detector composed of closely matched refractory materials;
    wherein said mounting hub is circular and the circumference of the mounting hub comprises a plurality of equi-spaced flexure receptacles.

2. The imaging device of claim 1 further comprising a multilayer board having the receptacle.

3. The imaging device of claim 2, wherein the multilayer board comprises a ceramic material and alumina.

4. The imaging device of claim 1, wherein the imaging sensor base is fabricated from a material selected from a group consisting of molybdenum, nickel steel alloy, nickel-cobalt ferrous alloy, beryllium, alumina and aluminum nitride.

5. The imaging device of claim 1 further comprising a readout integrated circuit (ROIC) sized to substantially match the size of the imaging sensor base and disposed on the image detector.

6. An imaging device comprising:
  an imaging sensor base having a top surface and a bottom surface and a mounting hub on said bottom surface;
  an image detector sized to substantially match a size of the imaging sensor base and bonded to the top surface of the imaging sensor base, the imaging sensor base and the image detector composed of closely matched refractory materials; and
  means for isolating temperature induced strain from the image detector;
  wherein said mounting hub is circular and the circumference of the mounting hub comprises a plurality of equi-spaced flexure receptacles.

7. The imaging device of claim 6, wherein the imaging sensor base is fabricated from a material selected from a group consisting of molybdenum, nickel steel alloy, nickel-cobalt ferrous alloy, beryllium, alumina and aluminum nitride.

8. The imaging device of claim 6 further comprising a multilayer board having a receptacle for receiving the mounting hub.

9. An imaging device comprising:
  an imaging sensor base having a top surface and a bottom surface and a mounting hub on said bottom surface;
  an image detector sized to substantially match a size of the imaging sensor base and bonded to the top surface of the imaging sensor base, the imaging sensor base and the image detector composed of closely matched refractory materials;
  means for isolating temperature induced strain from the image detector;
  a multilayer board having a receptacle for receiving the mounting hub;
  wherein the multilayer board comprises a plurality of equi-spaced flexure receptacles.

10. The imaging device of claim 6 or 9 further comprising a plurality of equi-spaced flexures distinct from said mounting hub and receptacles, said equi-spaced flexures arranged to engage with respective equi-spaced flexure receptacles, the plurality of equi-spaced flexures de-coupling thermally induced strain from the image detector to reduce directional deformation of the image detector.

11. A method of fabricating an imaging device comprising:
  bonding an image detector to a top surface of an imaging sensor base having a mounting hub on a bottom surface, the mounting hub substantially sized to fit into a receptacle, the imaging sensor base and the image detector composed of closely matched refractory materials;
  wherein said mounting hub is circular and the circumference of the mounting hub comprises a plurality of equi-spaced flexure receptacles.

12. The method of claim 11, wherein the imaging sensor base is fabricated from a material selected from a group consisting of molybdenum, nickel steel alloy, nickel-cobalt ferrous alloy, beryllium, alumina and aluminum nitride.

13. The method of claim 11 further comprising bonding the mounting hub of the imaging sensor base to a multilayer board.

14. The method of claim 11 wherein the multilayer board comprises a ceramic material and alumina.

15. A method of fabricating an imaging device having an image detector, an imaging sensor base, a multilayer board and a plurality of equi-spaced flexures, the image detector sized to substantially match a size of the imaging sensor base, the imaging sensor base having a mounting hub on a bottom surface and sized to fit into a receptacle of the multilayer board, the mounting hub and the multilayer board having a plurality of equi-spaced and opposite flexure receptacles, said equi-spaced flexures being distinct from said mounting hub and receptacles, the method comprising:
  coupling the image detector to a top surface of the imaging sensor base;
  engaging the plurality of equi-spaced flexures to the plurality of equi-spaced and opposite flexure receptacles of the mounting hub and the multilayer board; and
  coupling the mounting hub to the multilayer board.

16. The method of claim 15, wherein the imaging sensor base and the image detector are composed of closely matched refractory materials.

17. The method of claim 15 wherein each of the plurality of equi-spaced flexures comprises titanium or gamma alumina.

* * * * *